US012003168B2

(12) United States Patent
Eguchi et al.

(10) Patent No.: US 12,003,168 B2
(45) Date of Patent: Jun. 4, 2024

(54) ROTARY ELECTRIC MACHINE

(71) Applicant: KYB CORPORATION, Tokyo (JP)

(72) Inventors: Yuu Eguchi, Kanagawa (JP); Haruki Tomita, Kanagawa (JP); Shun Matsuda, Kanagawa (JP)

(73) Assignee: KYB Corporation, Tokyo (JP)

( * ) Notice: Subject to any disclaimer, the term of this patent is extended or adjusted under 35 U.S.C. 154(b) by 303 days.

(21) Appl. No.: 17/615,731

(22) PCT Filed: Mar. 26, 2020

(86) PCT No.: PCT/JP2020/013867
§ 371 (c)(1),
(2) Date: Dec. 1, 2021

(87) PCT Pub. No.: WO2020/250541
PCT Pub. Date: Dec. 17, 2020

(65) Prior Publication Data
US 2022/0247275 A1  Aug. 4, 2022

(30) Foreign Application Priority Data
Jun. 14, 2019 (JP) .................................. 2019-110748

(51) Int. Cl.
*H02K 9/22* (2006.01)
*H02K 5/04* (2006.01)

(52) U.S. Cl.
CPC ................. *H02K 9/22* (2013.01); *H02K 5/04* (2013.01)

(58) Field of Classification Search
CPC ............ H02K 5/225; H02K 5/04; H02K 5/10; H02K 5/163; H02K 9/227; H02K 9/223; H02K 9/22; H02K 11/33; H02K 11/215; H02K 11/40; H02K 11/0141
See application file for complete search history.

(56) References Cited

U.S. PATENT DOCUMENTS

| 10,931,162 B2 | 2/2021 | Tsutsui et al. | |
| 2006/0158049 A1* | 7/2006 | Suzuki | H02K 11/33 310/68 R |

FOREIGN PATENT DOCUMENTS

| JP | 2017184542 | 10/2017 |
| JP | 2018148688 | 9/2018 |

* cited by examiner

*Primary Examiner* — Bryan R Perez
(74) *Attorney, Agent, or Firm* — BainwoodHuang

(57) ABSTRACT

Increase the heat dissipation effect of the heat sink on the heat generating element.
In the rotary electric machine, the portions of the circuit board that are installed in the first and the second installation portion of the heat-sink are configured as non-coated portions, and the non-coated portion is not coated with resist. Therefore, the circuit board can be installed in the first and the second installation portion of the heat-sink without being affected by the variation in the film thickness of the resist. Thus, the gap between the FET mounted on the circuit board and the first to third heat dissipating portion of the heat-sink can be set as small as possible. Therefore, the heat generated by the FET can be efficiently transferred to the heat-sink. As described above, the heat dissipation effect of the heat-sink on the FET can be enhanced.

2 Claims, 13 Drawing Sheets

ROTARY ELECTRIC MACHINE

TECHNICAL FIELD

The present invention relates to a rotary electric machine.

BACKGROUND ART

In the motor (rotary electric machine) described in Patent Document 1 below, a heat-sink is provided at the opening of the housing of the motor, and a circuit board is provided on the side opposite to the motor portion with respect to the heat-sink. Further, a heat generating element is mounted on the surface of the circuit board on the heat-sink side, and thermal grease is interposed in the gap between the heat generating element and the heat-sink. As a result, the heat generated by the heat generating element is transferred to the heat-sink via the thermal grease and dissipated from the heat-sink.

By the way, from the viewpoint of enhancing the heat dissipation effect of the heat-sink on the heat generating element, it is desirable to make the gap between the heat generating element and the heat-sink as small as possible to efficiently transfer the heat generated by the heat generating element to the heat-sink.

CITATION LIST

Patent Document

[Patent Document 1]
Japanese Unexamined Patent Publication No. 2017-184542.

SUMMARY OF INVENTION

Technical Problem

However, a protective film coated with a resist for protecting the circuit board is generally formed on the surface of the circuit board. Therefore, it is necessary to set the gap between the heat generating element and the heat-sink to a size that takes into consideration the variation in the thickness dimension of the protective film. As a result, the gap between the heat generating element and the heat-sink becomes relatively large, and the efficiency of transferring the heat generated by the heat generating element to the heat-sink may decrease.

In view of the above facts, an object of the present invention is to provide a rotary electric machine capable of enhancing the heat dissipation effect of the heat-sink on the heat generating element.

Solution of Problem

At least one embodiment of the present invention is a rotary electric machine comprising: a motor unit with a bottomed cylindrical housing with one end in the axial direction closed; a heat-sink that closes the opening of the housing and has a protruding installation portion; a substrate that is fixed to the installation portion and is configured as a non-coating portion to which the portion installed in the installation portion is not coated with a resist; a heat generating element mounted on a surface of the substrate facing the heat-sink; a heat transfer member provided between the heat-sink and the heat generating element.

At least one embodiment of the present invention is a rotary electric machine characterized in that: the installation portion has a first installation portion extending in the circumferential direction on the outer peripheral portion of the heat-sink; a ground pattern is formed on the non-coated portion installed in the first installation portion; the heat generating element is arranged inside the first installation portion when viewed from the plate thickness direction of the substrate.

At least one embodiment of the present invention is a rotary electric machine characterized in that: the length of the first installation portion in the longitudinal direction is set to ½ or more of the length of the entire circumference of the heat-sink in the circumferential direction.

DESCRIPTION OF EMBODIMENTS

Figure 1:
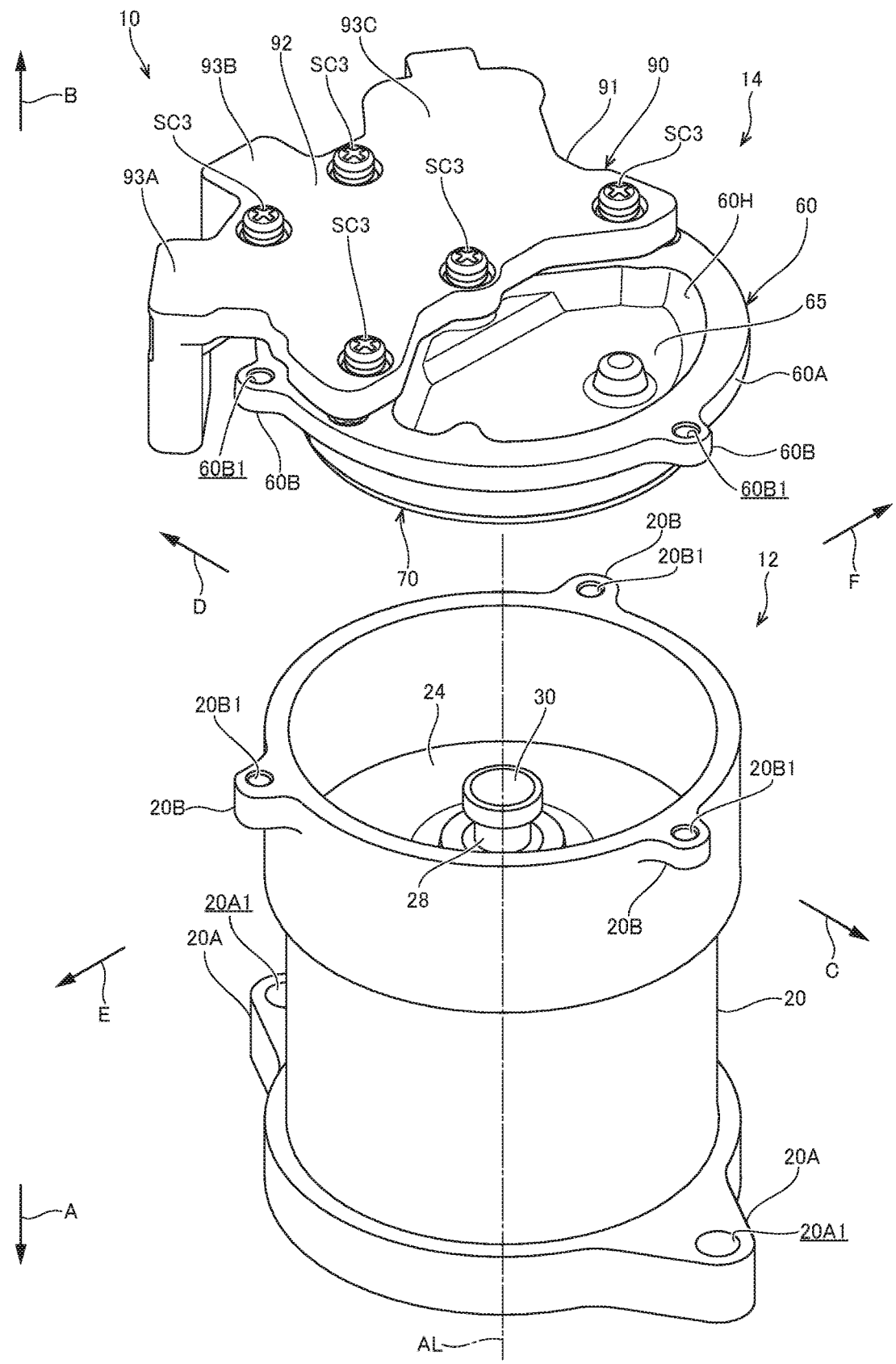
FIG. 1 is a perspective view which shows the rotary electric machine according to this embodiment in a partially disassembled state.
Figure 2:
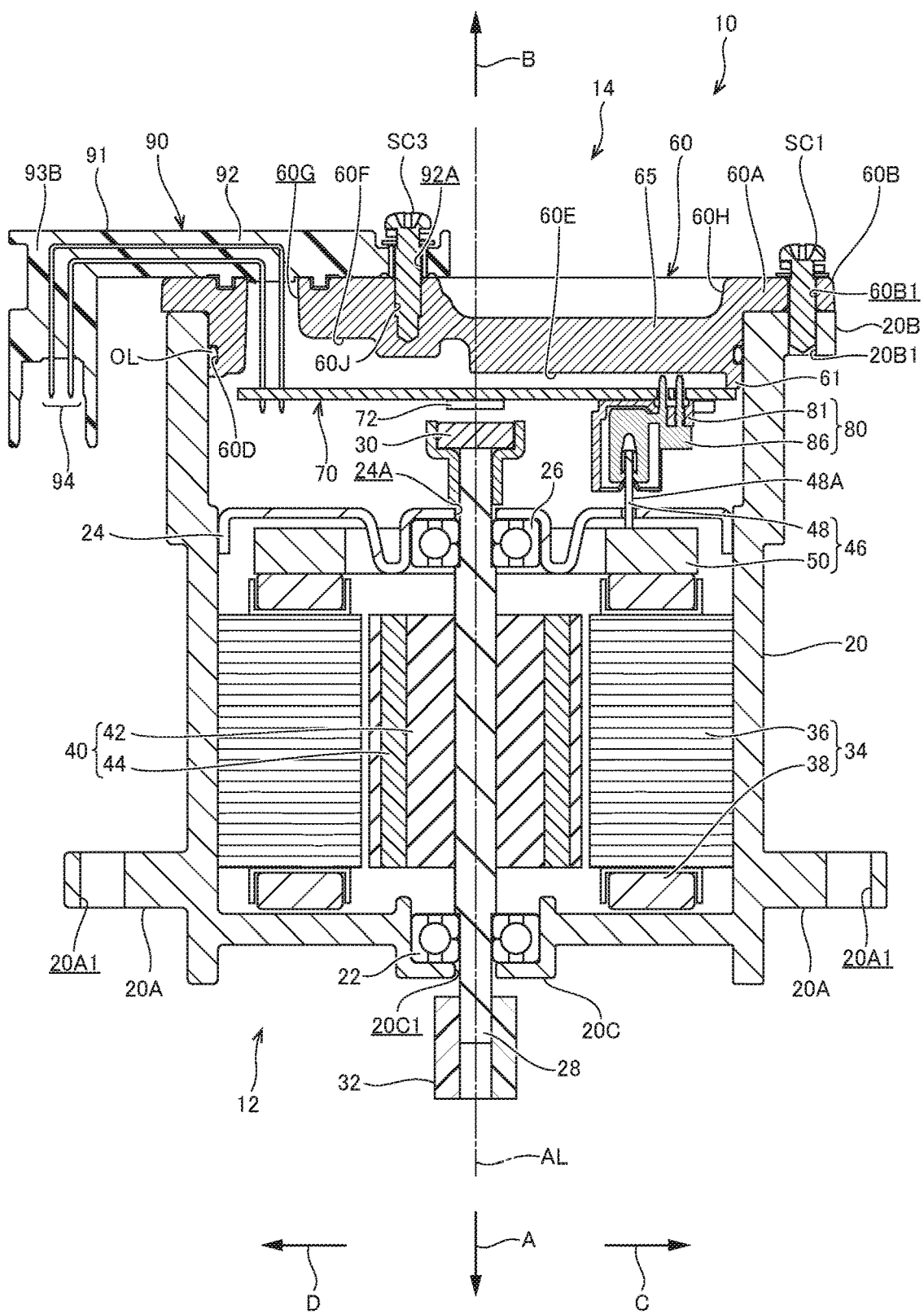
FIG. 2 is a vertical sectional view seen from one side of the second direction which shows the rotary electric machine according to this embodiment.

Hereinafter, the rotary electric machine 10 according to the present embodiment will be described with reference to the drawings. The rotary electric machine 10 is configured as a rotary electric machine applied to a steering device of a vehicle (automobile). As shown in FIGS. 1 and 2, the rotary electric machine 10 is formed in a roughly columnar shape as a whole. Further, the rotary electric machine 10 comprises a motor portion 12 and an ECU unit 14 for controlling the rotation of the motor portion 12. Hereinafter, each configuration of the rotary electric machine 10 will be described.

In the following description, one side of the rotary electric machine 10 in the axial direction (arrow A direction side of FIGS. 1 and 2) is the lower side of the rotary electric machine 10, and the other side of the rotary electric machine 10 in the axial direction (arrow B direction side of FIGS. 1 and 2) is the upper side of the rotary electric machine 10. In the following description, when the vertical direction is used, the upper-lower direction of the rotary electric machine 10 is indicated unless otherwise specified.

Further, in the following description, in a plan view seen from above, the direction orthogonal to the vertical direction is defined as the first direction (cf. arrows C and D in FIGS. 1 and 2), and the direction orthogonal to the first direction is defined as the second direction (cf. arrow E and arrow F in FIG. 1).

Figure 4A:
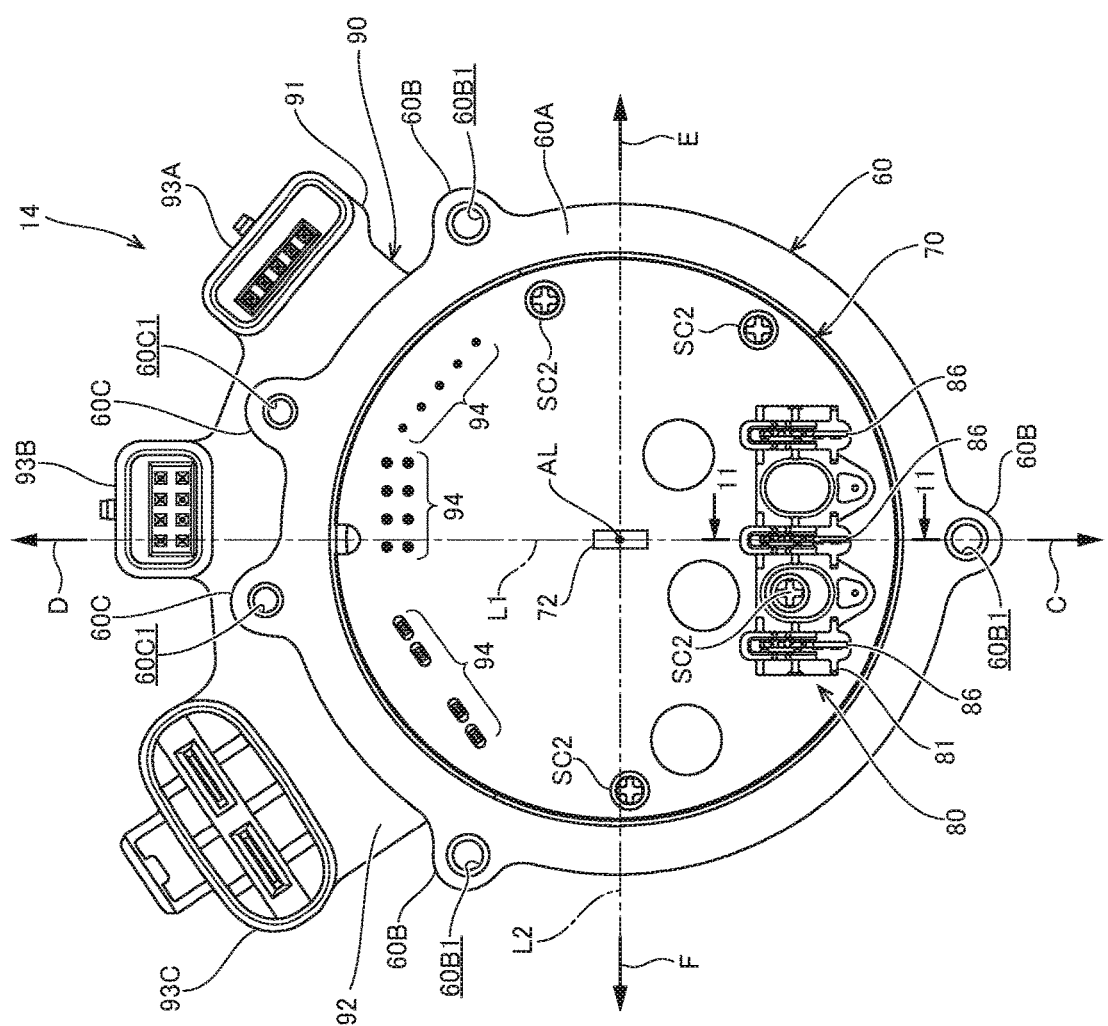
FIG. 4A is a bottom view of the ECU unit shown in FIG. 1 as viewed from below.
Figure 4B:
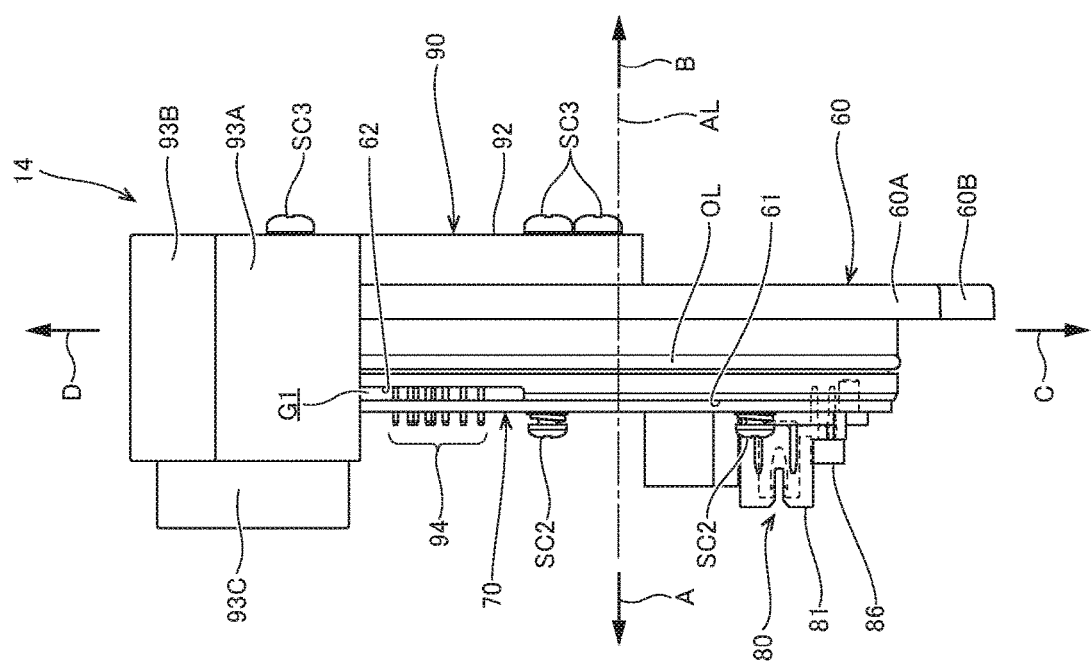
FIG. 4B is a side view showing the ECU unit of FIG. 4A.
Figure 7:
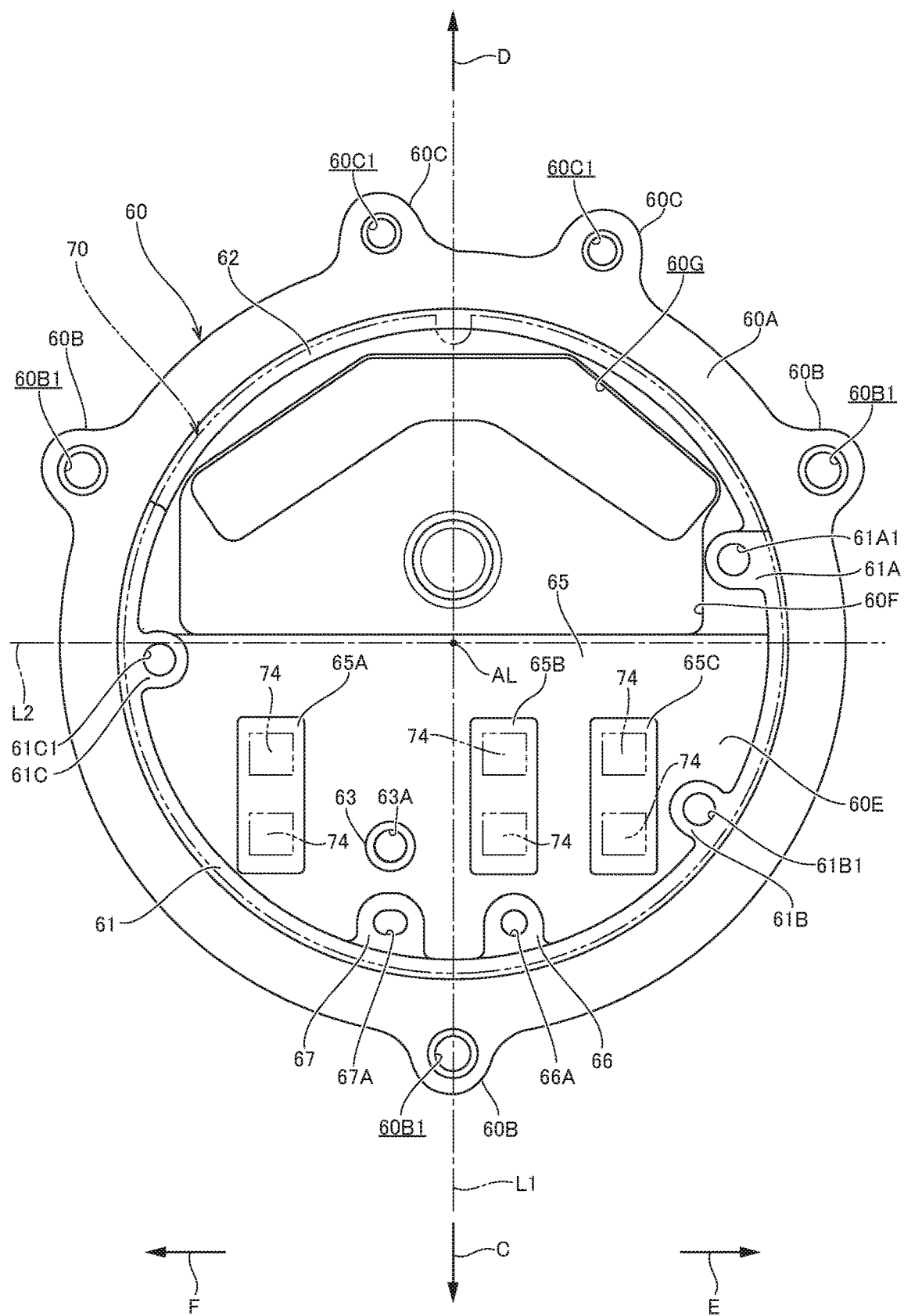
FIG. 7 is a bottom view of the heat-sink shown in FIG. 5 as viewed from below.

In addition, in a plan view, the overhead line that passes through the axis AL of the rotary electric machine 10 and extends in the first direction is defined as the first reference line L1 (cf. FIGS. 4 and 7), and the overhead line that passes through the axis AL of the rotary electric machine 10 and extends in the second direction is defined as the second reference line L2 (cf. FIGS. 4 and 7).

(The Motor Portion 12)

As shown in FIGS. 1 and 2, the motor portion 12 is configured as a three-phase alternating current brushless motor. The motor portion 12 comprises a housing 20, a plate holder 24 housed in the housing 20, a rotating shaft 28, a stator 34, a rotor 40, and a bus-bar unit 46.

<The Housing 20>

The housing 20 is formed in a roughly bottomed cylindrical shape that is open to the upper side, and constitutes the outer shell of the rotary electric machine 10. A pair of mounting pieces 20A are integrally formed on the outer peripheral portion of the lower end portion of the housing 20. The pair of mounting pieces 20A are arranged with the axial direction of the housing 20 as the plate thickness direction, and project from the housing 20 to one side in the first direction (arrow C direction side of FIGS. 1 and 2) and the other side in the first direction (arrow D direction side of FIGS. 1 and 2). A mounting hole 20A1 is formed through the mounting piece 20A. A fastening member such as a bolt (not shown) is inserted into the mounting hole 20A1, and the housing 20 (that is, the rotary electric machine 10) is fixed to the steering device by the fastening member.

A plurality of (three locations in the present embodiment) fixing portions 20B extending outward in the radial direction are formed on the outer peripheral portion of the opening end portion of the housing 20. One fixing portion 20B protrudes from the housing 20 to one side in the first direction, and three fixing portions 20B are arranged at equal intervals in the circumferential direction of the housing 20. A screw portion 20B1 for fixing the heat-sink 60, which will be described later, is formed through the fixing portion 20B, and a female screw is formed on the inner peripheral surface of the screw portion 20B1.

Further, in the central portion of the bottom wall of the housing 20, a bottomed cylindrical fixed cylinder portion 20C that is bulged downward is integrally formed, and a first bearing 22 for supporting the rotating shaft 28, which will be described later, is fitted in the fixed cylinder portion 20C. An insertion hole 20C1 for inserting a rotating shaft 28, which will be described later, is formed through the bottom wall of the fixed cylinder portion 20C, and the inside of the first bearing 22 and the outside of the housing 20 are communicated with each other by the insertion hole 20C1.

<Plate Holder 24>

The plate holder 24 is formed in a roughly circular plate shape with the vertical direction as the plate thickness direction, and is fitted in the intermediate portion in the vertical direction of the housing 20. An insertion hole 24A for inserting a rotating shaft 28, which will be described later, is formed through the central portion of the plate holder 24. Further, a second bearing 26 for supporting the rotating shaft 28, which will be described later, is fixed to the central portion of the plate holder 24, and the second bearing 26 and the first bearing 22 are arranged coaxially.

<Rotating Shaft 28>

The rotating shaft 28 is formed in the shape of a round bar extending in the vertical direction, and is arranged coaxially with the housing 20 inside the housing 20. The portion of the lower end side of the rotating shaft 28 is rotatably supported by the first bearing 22, and the portion of the upper end side of the rotating shaft 28 is rotatably supported by the second bearing 26. The upper end of the rotating shaft 28 projects upward with respect to the plate holder 24, and the magnet 30 is fixed to the upper end. On the other hand, the lower end portion of the rotating shaft 28 projects downward with respect to the bottom wall of the housing 20, and the gear 32 connected to the steering device is fixed to the lower end portion.

<Stator 34>

The stator 34 is arranged inside the housing 20 on the lower side of the plate holder 24 and on the outer side in the radial direction of the rotating shaft 28. The stator 34 has a stator core 36 made of a magnetic material, and the stator core 36 is formed in a cylindrical shape and is fitted inside the housing 20. Further, a winding 38 corresponding to the U-phase, the V-phase, and the W-phase is wound around the stator core 36.

<Rotor 40>

The rotor 40 has a rotor core 42, and the rotor core 42 is formed in a cylindrical shape with the vertical direction as the axial direction, and is arranged inside the stator 34 in the radial direction. The rotating shaft 28 is fitted into the shaft core portion of the rotor core 42, and the rotor core 42 (rotor 40) and the rotating shaft 28 are configured to be integrally rotatable. Further, a plurality of magnets 44 (permanent magnets) are fixed in the rotor core 42. As a result, the rotor 40 and the rotating shaft 28 are integrally rotated around the axis AL by passing a current through the U-phase, V-phase, and W-phase windings 38 of the stator 34.

<Bus-Bar Unit 46>

Figure 3:
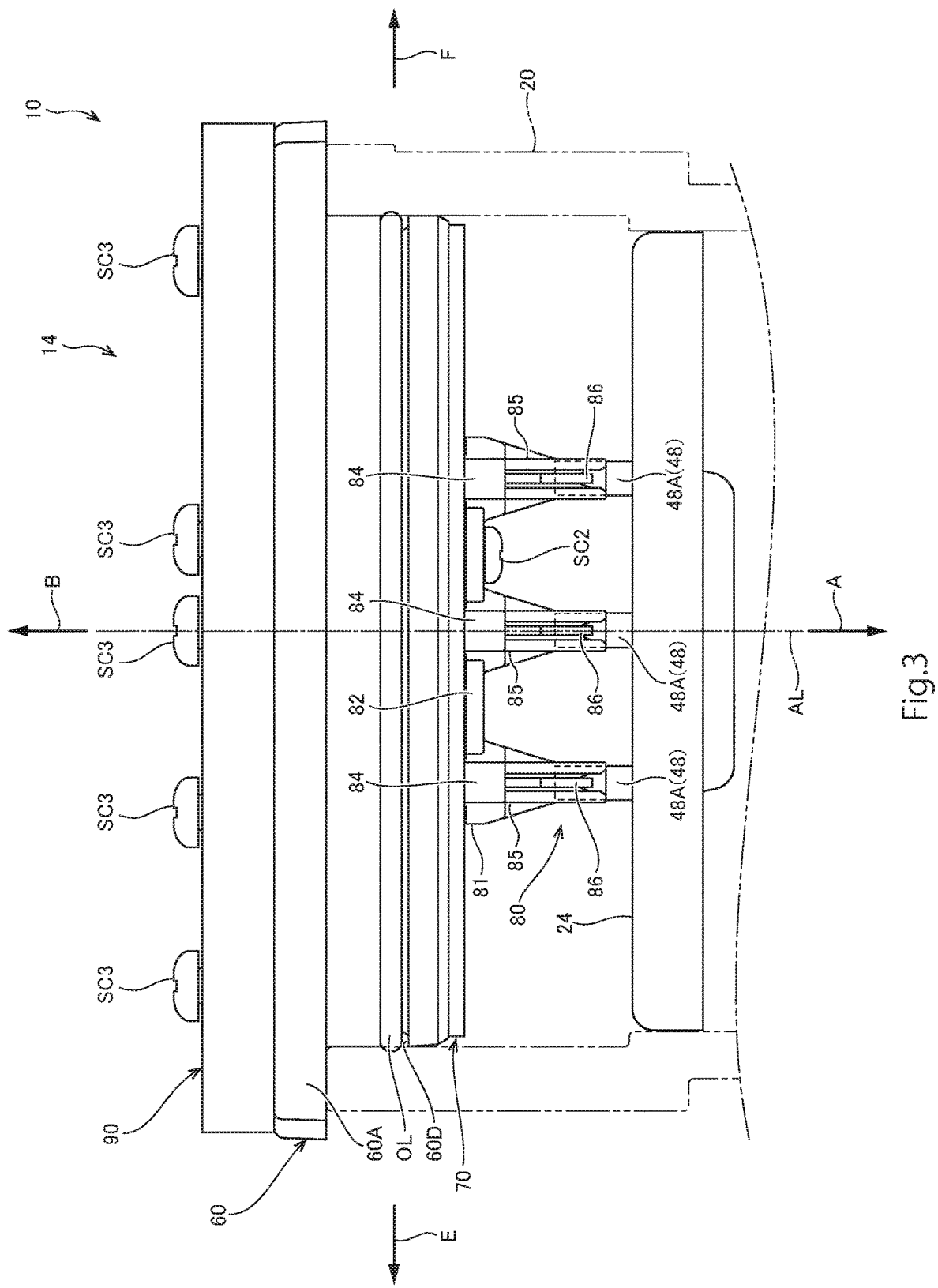
FIG. 3 is a side view seen from one side of the first direction which shows the connection state of a bus-bar and a connector shown in FIG. 2.

The bus-bar unit 46 is arranged above the stator 34 and is held by the plate holder 24. The bus-bar unit 46 comprises three bus-bars 48 corresponding to the U-phase, V-phase, and W-phase windings 38 of the stator 34, and a bus-bar holder 50 for holding the bus-bar 48. One end of the bus-bar 48 is connected to each of the U-phase, V-phase, and W-phase windings 38 of the stator 34. As shown in FIG. 3, the other end of the bus-bar 48 is configured as a bus-bar terminal 48A, and the bus-bar terminal 48A projects upward from the plate holder 24 and is arranged side by side in the second direction. Further, the bus-bar terminal portion 48A is formed in a roughly long plate shape having the first direction as the plate thickness direction and extending in the vertical direction. The bus-bar terminal portion 48A is connected to the connection terminal 86 of the connector 80 described later.

(ECU Unit 14)

As shown in FIGS. 1 to 3, the ECU unit 14 is assembled to the open end of the housing 20 to form the upper end of the rotary electric machine 10. The ECU unit 14 comprises a heat-sink 60, a circuit board 70 as a "substrate" for controlling the motor portion 12, and a connector assembly 90 connected to the circuit board 70.

<Heat-Sink 60>

As shown in FIGS. 1 to 7, the heat-sink 60 is made of an aluminum alloy or the like having high thermal conductivity. The heat-sink 60 is formed in a roughly disk shape with the vertical direction as the plate thickness direction. A flange portion 60A extending radially outward is integrally formed on the outer peripheral portion of the upper end portion of the heat-sink 60, and the flange portion 60A is formed over the entire circumference of the heat-sink 60 in the circumferential direction. The heat-sink 60 is fitted into the opening of the housing 20 from above, and the flange portion 60A is arranged adjacent to the upper side of the opening end surface of the housing 20. As a result, the opening of the housing 20 is closed by the heat-sink 60. That is, the heat-sink 60 is configured as the lid portion of the housing 20, and also constitutes a part of the outer shell of the rotary electric machine 10.

Further, the flange portion 60A is integrally formed with three first fixing portions 60B protruding outward in the radial direction at positions corresponding to the screw portions 20B1 of the housing 20. A fixing hole 60B1 is formed through the first fixing portion 60B. The heat-sink 60 is fixed to the housing 20 by inserting the fixing screw SC1 into the fixing hole 60B1 from above and screwing it into the screw portion 20B1 of the housing 20.

Further, A pair of second fixing portions 60C extending outward in the radial direction are integrally formed on the portion of the flange portion 60A on the other side in the first direction, and the second fixing portions 60C are arranged side by side in the circumferential direction of the heat-sink 60. A first fixing screw portion 60C1 for fixing the connector assembly 90, which will be described later, is formed through the second fixing portion 60C, and a female screw is formed on the inner peripheral surface of the first fixing screw portion 60C1.

A seal groove 60D is formed in the vertical intermediate portion of the outer peripheral portion of the heat-sink 60. The seal groove 60D is opened to the outside in the radial direction of the heat-sink 60, and extends over the entire circumference of the heat-sink 60 in the circumferential direction. A ring-shaped O-ring OL is housed in the seal groove 60D, and the O-ring OL is made of an elastic member such as rubber. In the fixed state of the heat-sink 60 to the housing 20, the O-ring OL is elastically deformed and is in close contact with the inner peripheral surface of the seal groove 60D and the inner peripheral surface of the housing 20. As a result, the space between the heat-sink 60 and the open end of the housing 20 is sealed by the O-ring OL to ensure the airtightness inside the housing 20.

Figure 5:
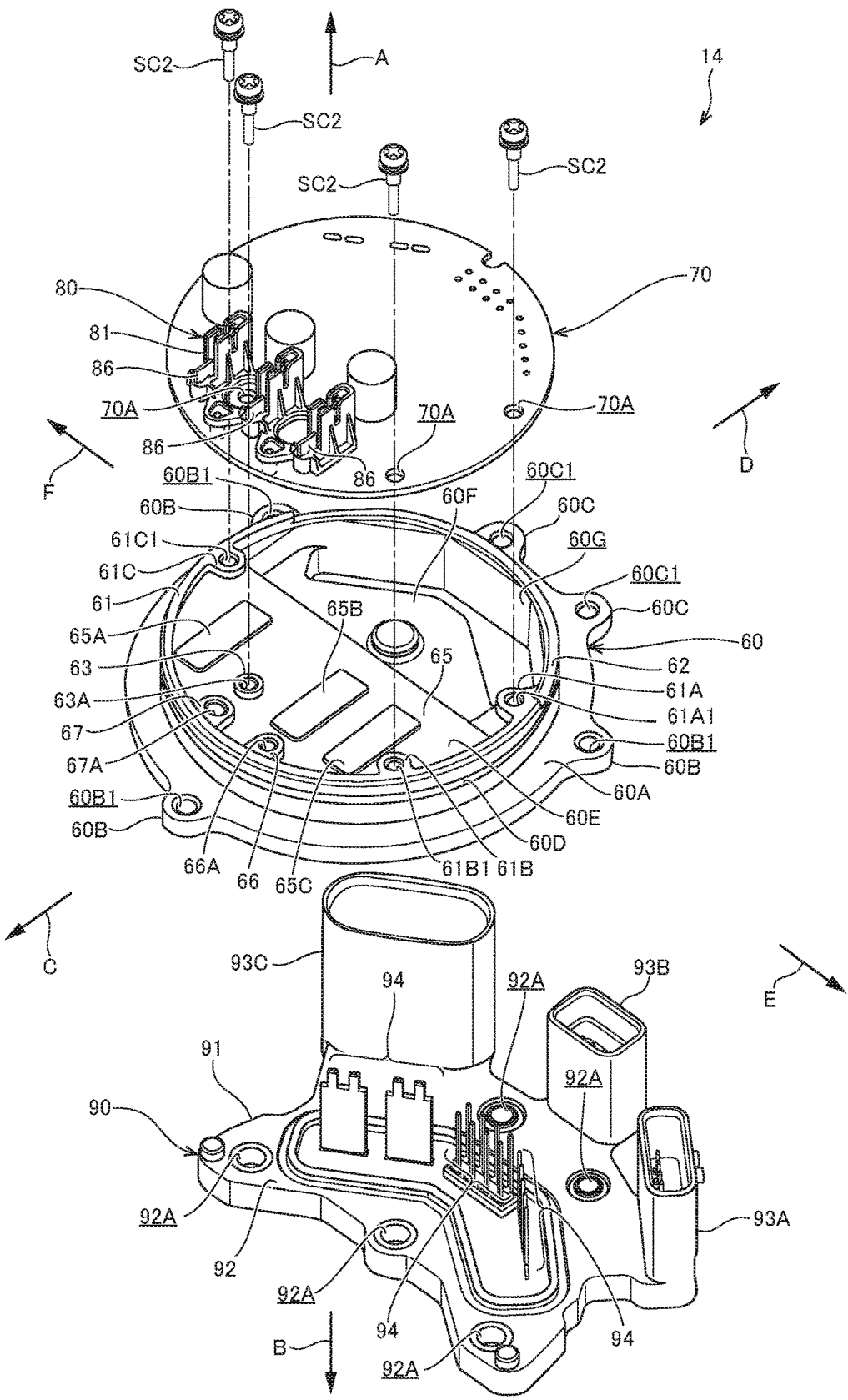
FIG. 5 is an exploded perspective view of the ECU unit shown in FIG. 4 disassembled and viewed from below.

As shown in FIGS. 5 and 7, a first installation portion 61 as an "installation portion" for installing the circuit board 70, which will be described later, is formed on the outer peripheral portion of the lower surface 60E of the heat-sink 60. The first installation portion 61 projects downward from the lower surface 60E of the heat-sink 60 and is formed in a rib shape extending along the circumferential direction of the heat-sink 60. Further, most of the first installation portion 61 is formed on the outer peripheral portion of the heat-sink 60 on one side in the first direction and when viewed from below, the first installation portion 61 is formed in a roughly C shape (arc-shape) that is open to the other side in the first direction. That is, on the outer peripheral portion of the lower surface 60E of the heat-sink 60, a step portion 62 which is one step lower to the upper side than the first installation portion 61 is formed on the portion on the other side in the first direction. Further, both ends in the longitudinal direction of the first installation portion 61 are arranged on the other side in the first direction with respect to the second reference line L2 in a bottom view (cf. FIG. 7). That is, the length of the first installation portion 61 in the longitudinal direction is set to ½ or more of the total length in the circumferential direction of the heat-sink 60 (In the present embodiment, the length of the first installation portion 61 in the longitudinal direction is set to approximately two-thirds of the total length of the heat sink 60 in the circumferential direction). The step portion 62 is formed in an arc shape that is open to one side in the first direction when viewed from the bottom.

Further, the first installation portion 61 has a first substrate fixing portions 61A, a second substrate fixing portion 61B, and a third substrate fixing portion 61C protruding inward in the radial direction of the heat-sink 60 as a three "substrate fixing portion", wherein the tip surface (lower surface) of the first substrate fixing portion 61A to the third substrate fixing portion 61C is arranged flush with the tip surface (lower surface) of the first installation portion 61. The first substrate fixing portion 61A, the second substrate fixing portion 61B, and the third substrate fixing portion 61C are respectively formed with a concave first substrate fixing screw portion 61A1, the second substrate fixing screw portion 61B1, and the third substrate fixing screw portion 61C1 that is open downward. Female threads are formed on the inner peripheral surfaces of the first substrate fixing screw portion 61A1, the second substrate fixing screw portion 61B1, and the third substrate fixing screw portion 61C1.

Further, the first substrate fixing portion 61A is formed at one end in the longitudinal direction of the first installation portion 61, and arranged on one side in the second direction (arrow E direction side in FIG. 7) with respect to the first reference line L1 and on the other side in the first direction with respect to the second reference line L2. The second substrate fixing portion 61B is formed on one side in the longitudinal direction of the first installation portion 61. Specifically, the second substrate fixing portion 61B is arranged on one side in the second direction with respect to the first reference line L1 and on one side in the first direction with respect to the second reference line L2, in a bottom view. The third substrate fixing portion 61C is formed on the other side portion in the longitudinal direction of the first installation portion 61. Specifically, the third substrate fixing portion 61C is arranged on the other side in the second direction (arrow F direction side in FIG. 7) with respect to the first reference line L1 and slightly deviated from the one side in the first direction with respect to the second reference line L2, in the bottom view.

Further, a second installation portion 63 as an "installation portion" for installing and fixing the circuit board 70, which will be described later, is formed on the lower surface 60E of the heat-sink 60. The second installation portion 63 is formed in a roughly cylindrical shape having a relatively low height protruding downward, and the tip surface (lower surface) of the second installation portion 63 is arranged flush with the tip surface (lower surface) of the first installation portion 61. A fourth substrate fixing screw portion 63A is formed inside the second installation portion 63, and a female screw is formed on the inner surface of the fourth substrate fixing screw portion 63A. Further, the second installation portion 63 is arranged at a position on the other side in the second direction with respect to the first reference line L1 and on one side in the first direction with respect to the second reference line L2 in the bottom view.

Further, a portion of the heat-sink 60 on one side in the first direction (specifically, the portion on one side in the first direction from the position slightly deviated to the other side in the first direction with respect to the second reference line L2) is configured as a heat dissipating portion 65 for dissipating heat generated by the FET 74 of the circuit board 70, which will be described later. The heat dissipating portion 65 is formed with a first heat dissipating portion 65A, a second heat dissipating portion 65B, and a third heat dissipating portion 65C protruding downward from the lower surface 60E of the heat-sink 60. The first heat dissipating portion 65A to the third heat dissipating portion 65C are formed in a roughly rectangular shape with the first direction as the longitudinal direction, in the bottom view. The amount of protrusion from the lower surface 60E of the first heat dissipating portion 65A to the third heat dissipating portion 65C is set to be smaller than the amount of protrusion from the lower surface 60E of the first installation portion 61. That is, the lower surfaces of the first heat dissipating portion 65A to the third heat dissipating portion 65C are arranged above the lower surface of the first installation portion 61.

Further, the first heat dissipating portion 65A to the third heat dissipating portion 65C are arranged side by side at a predetermined interval in the second direction. Specifically, the first heat dissipating portion 65A is arranged between the third substrate fixing portion 61C and the second installation portion 63, in a bottom view. In other words, the third substrate fixing portion 61C, the first heat dissipating portion 65A, and the second installation portion 63 are arranged side by side in this order on one side in the second direction.

The second heat dissipating portion 65B and the third heat dissipating portion 65C are arranged side by side in the second direction at positions between the second substrate fixing portion 61B and the second installation portion 63, in a bottom view. In other words, the second installation portion 63, the second heat dissipating portion 65B, the third heat dissipating portion 65C, and the second substrate fixing portion 61B are arranged side by side in this order on one side in the second direction.

Further, a pair of positioning portions 66, 67 for determining the position of the connector 80 of the circuit board 70, which will be described later, are formed on the lower surface 60E of the heat-sink 60. The positioning portions 66 and 67 project downward from the lower surface 60E of the heat-sink 60, and the amount of protrusion from the lower surface 60E of the positioning portions 66 and 67 is set to be smaller than the amount of protrusion from the lower surface 60E of the first installation portion 61. Further, the positioning portions 66 and 67 are arranged on the outer peripheral side of the lower surface 60E of the heat-sink 60 on one side in the first direction, and are arranged adjacent to the inner side in the radial direction of the first installation portion 61. Specifically, the pair of positioning portions 66, 67 are arranged at positions symmetrical with respect to the first reference line L1 in the second direction in the bottom view.

A concave first positioning hole 66A opened downward is formed on the lower surface of the positioning portion 66 on one side in the second direction, and the first positioning hole 66A is formed in a circular shape when viewed from the bottom. On the other hand, a concave second positioning hole 67A opened downward is formed on the lower surface of the positioning portion 67 on the other side in the second direction, and the second positioning hole 67A is formed in a roughly track shape with the second direction as the longitudinal direction when viewed from the bottom. The width direction (first direction) of the second positioning hole 67A is set to match the diameter of the first positioning hole 66A.

The lower surface 60E of the heat-sink 60 is formed with a recess 60F open to the lower side in a portion other than the heat dissipating portion 65 (the portion on the other side in the first direction), and the recess 60F is formed in a roughly hexagonal shape when viewed from the bottom. A terminal insertion portion 60G as an "insertion portion" for inserting the terminal 94 of the connector assembly 90, which will be described later, is formed through the portion on the other side in the first direction of the recess 60F. The terminal insertion portion 60G is formed in a roughly V shape open to one side in the first direction in a bottom view. Further, the terminal insertion portion 60G is arranged on the other side in the first direction with respect to the first installation portion 61 and is arranged on the radial inside of the step portion 62 in the bottom view.

Figure 6:
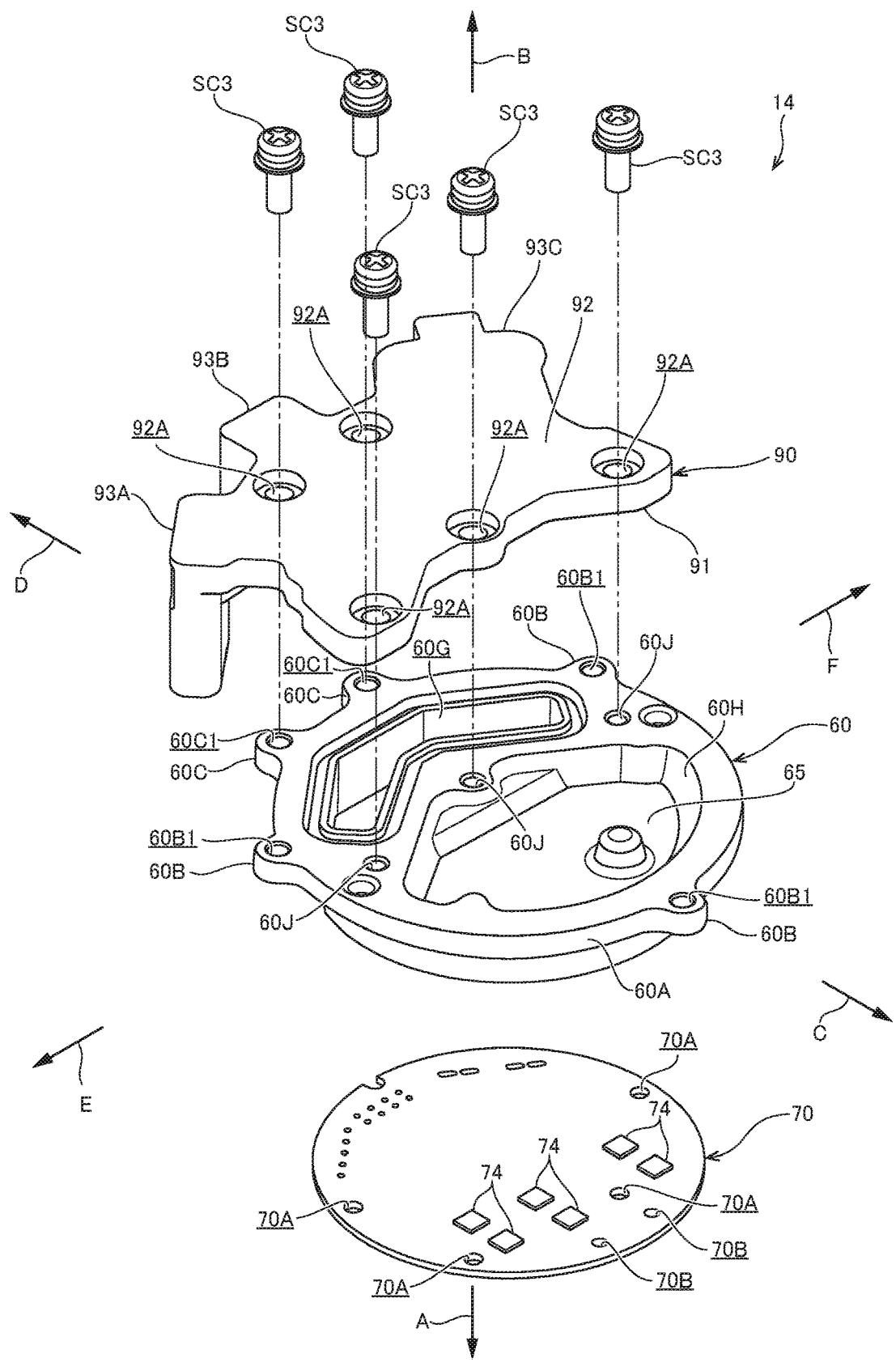
FIG. 6 is an exploded perspective view of the ECU unit shown in FIG. 4 disassembled and viewed from above.

As shown in FIG. 6, on the upper surface of the heat-sink 60, a relief 60H opened upward is formed on the portion on one side in the first direction, and the relief 60H is formed in a roughly fan shape in a plan view.

Further, on the upper surface of the heat-sink 60, a plurality of (three places in this embodiment) second fixing screw portions 60J for fixing the connector assembly 90, which will be described later, are formed at positions between the relief 60H and the terminal insertion portion 60G. The second fixing screw portion 60J is formed in a concave shape that is open to the upper side of the heat-sink 60, and a female screw is formed on the inner peripheral surface of the second fixing screw portion 60J. The second fixing screw portions 60J at three locations are arranged at predetermined intervals in the second direction in a plan view.

<Circuit Board 70>

As shown in FIGS. 1-8, the circuit board 70 is formed in a disk shape with the vertical direction as the plate thickness direction, and the diameter of the circuit board 70 is set to be slightly smaller than the diameter of the heat-sink 60. The circuit board 70 is arranged coaxially with the heat-sink 60 and adjacent to the lower side of the first installation portion 61 and the second installation portion 63 of the heat-sink 60. As a result, a gap G1 (cf. FIG. 4B) is formed in the vertical direction between the outer peripheral portion of the circuit board 70 on the other side in the first direction and the stepped portion 62 of the heat-sink 60.

Further, the circuit board 70 is formed through four substrate fixing holes 70A (cf. FIGS. 6 and 8) at positions corresponding to the first substrate fixing screw portions 61A1 to the fourth substrate fixing screw portion 63A of the heat-sink 60. The circuit board 70 is fixed to the heat-sink by inserting the fixing screw SC2 into the substrate fixing hole 70A from below and screwing it into the first substrate fixing screw portion 61A1 to the fourth substrate fixing screw portion 63A. As a result, the motor portion 12 is arranged on one side in the plate thickness direction (lower side) of the circuit board 70.

Figure 8:
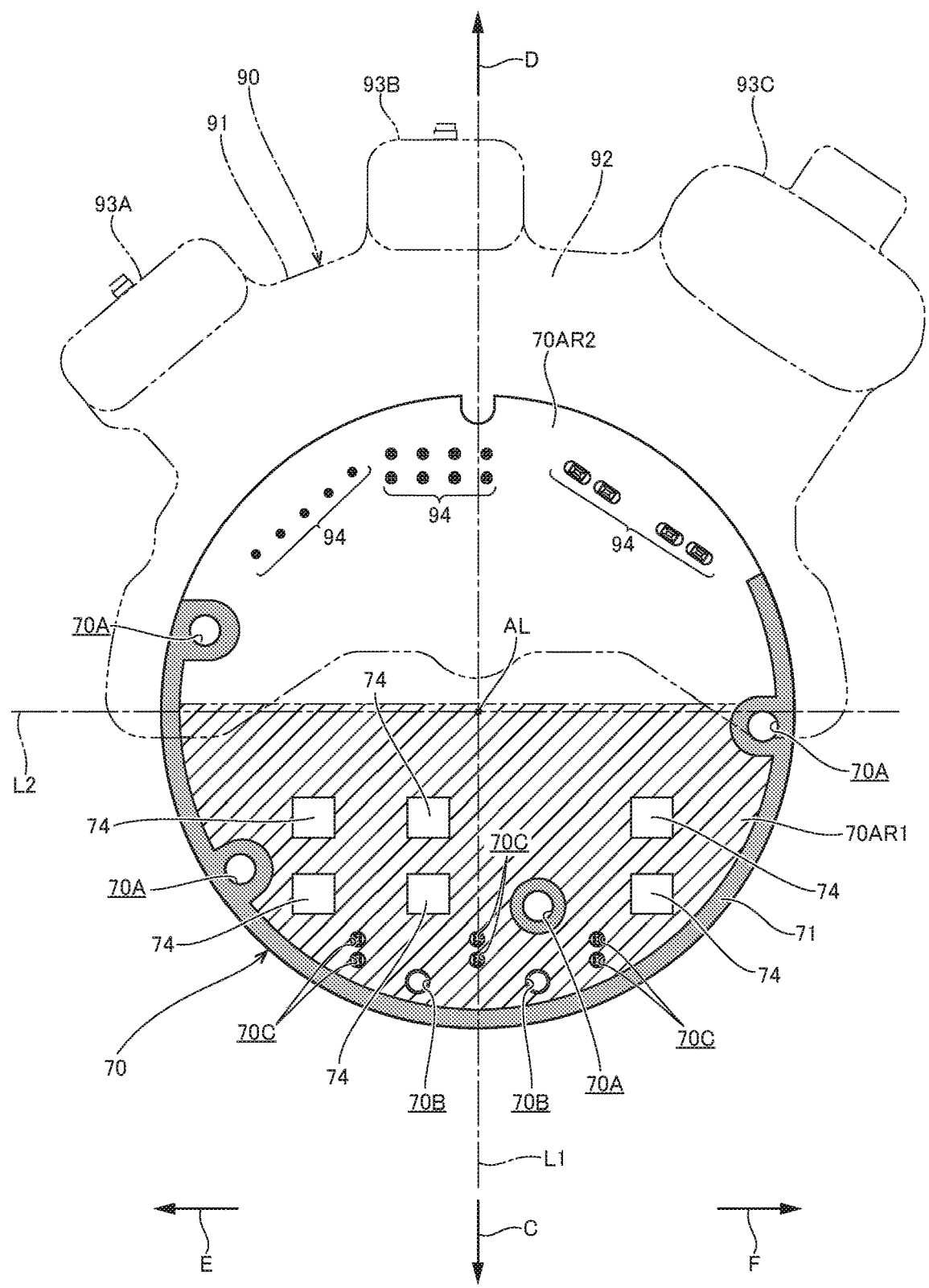
FIG. 8 is a plan view seen from the upper side of the circuit board shown in FIG. 6.
Figure 9:
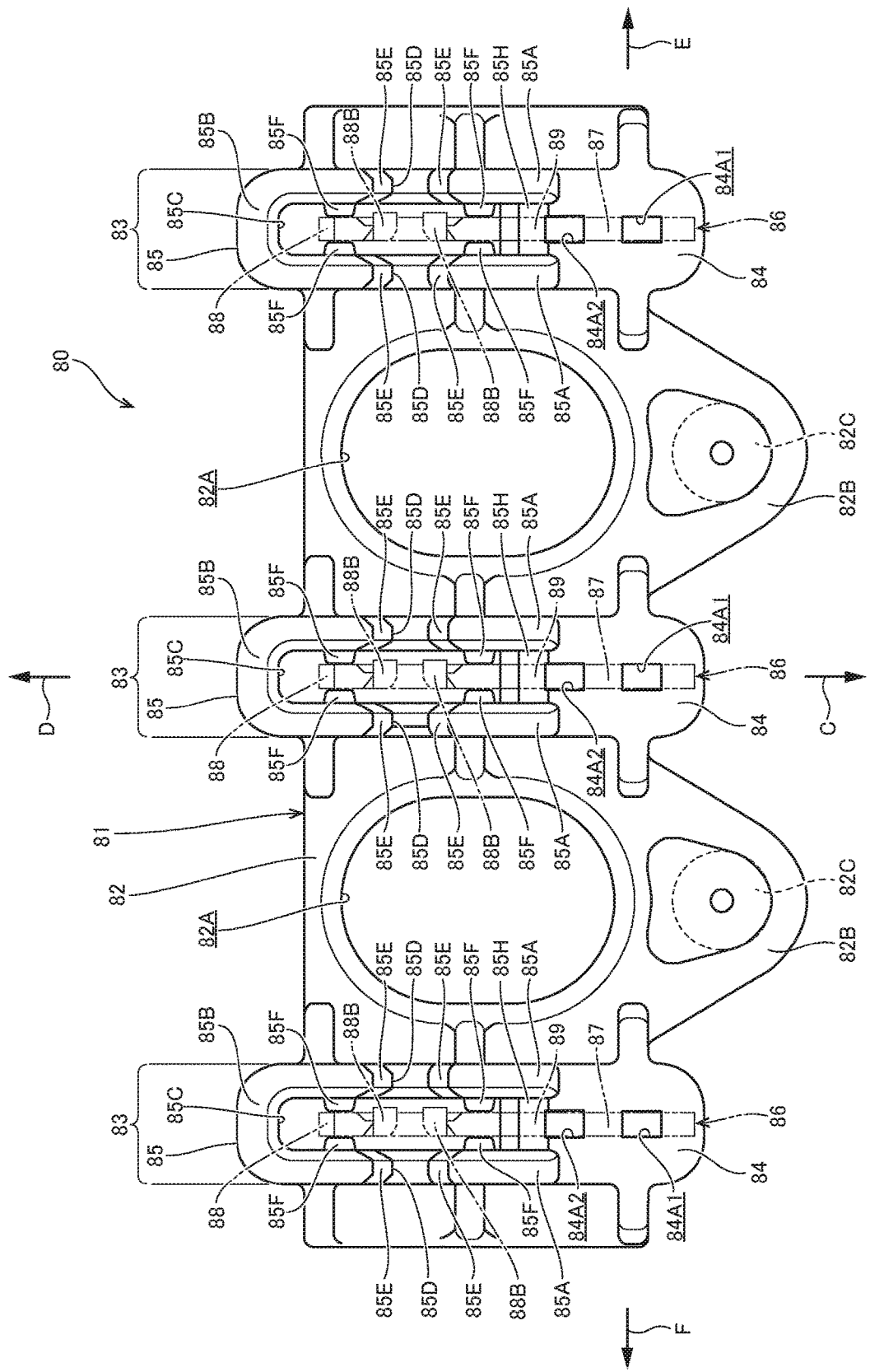
FIG. 9 is a bottom view seen from the lower side which shows the connector shown in FIG. 5 in an enlarged manner.

Here, the portions installed on the first installation portion 61 and the second installation portion 63 of the heat-sink 60 on the upper surface of the circuit board 70 (opposite surface facing the heat-sink 60 in the vertical direction) are configured as non-coated portion 71 to which no resist is applied (cf. the gray area in FIG. 8). A ground pattern is formed on the non-coated portion 71 of the circuit board 70, and the ground pattern is in contact with the first installation portion 61 and the second installation portion 63 of the heat-sink 60. That is, the circuit board 70 is ground-installed on the first installation portion 61 and the second installation portion 63 of the heat-sink 60.

Further, the upper surface of the circuit board 70 is divided into the first area 70AR1 arranged vertically facing the heat dissipating portion 65 of the heat-sink 60 (cf. the hatched portion in FIG. 8) and the second area 70AR2 arranged vertically facing the recess 60F of the heat-sink 60. The first area 70AR1 is mainly provided with electronic components of the power supply system in the rotary electric machine 10, and the second area 70AR2 is mainly provided with electronic components of the control system in the rotary electric machine 10.

Specifically, as shown in FIGS. 6 to 8, FET 74s as a plurality of "heating elements" are provided (mounted) in the first area 70AR1 of the circuit board 70. That is, the plurality of FETs 74 are arranged inside in the radial direction of the first installation portion 61 in a bottom view. The plurality of FETs 74 are arranged at positions corresponding to the first heat dissipating portion 65A, the second heat dissipating portion 65B, and the third heat dissipating portion 65C of the heat-sink 60. Specifically, on the circuit board 70, a pair of FETs 74 are arranged at positions corresponding to the first heat dissipating portion 65A, the second heat dissipating portion 65B, and the third heat dissipating portion 65C of the heat-sink 60, and the paired FETs 74 are arranged side by side in the first direction (cf. FIG. 7). As a result, a plurality of FETs 74 are grouped into a first group arranged on one side in the second direction with respect to the first reference line L1 (a group of four FETs 74 corresponding to the second heat dissipating portion 65B and the third heat dissipating portion 65C) and a second group arranged on the other side of the second direction with respect to the first reference line L1 (a group of two FETs 74 corresponding to the first heat dissipating portion 65A). The second installation portion 63 of the heat-sink 60 is arranged between the first group and the second group of the FET 74. More specifically, the first group of FET 74 is arranged between the second installation portion 63 and the second substrate fixing portion 61B, and the second group of FETs 74 is arranged between the third substrate fixing portion 61C and the second installation portion 63.

Figure 12:
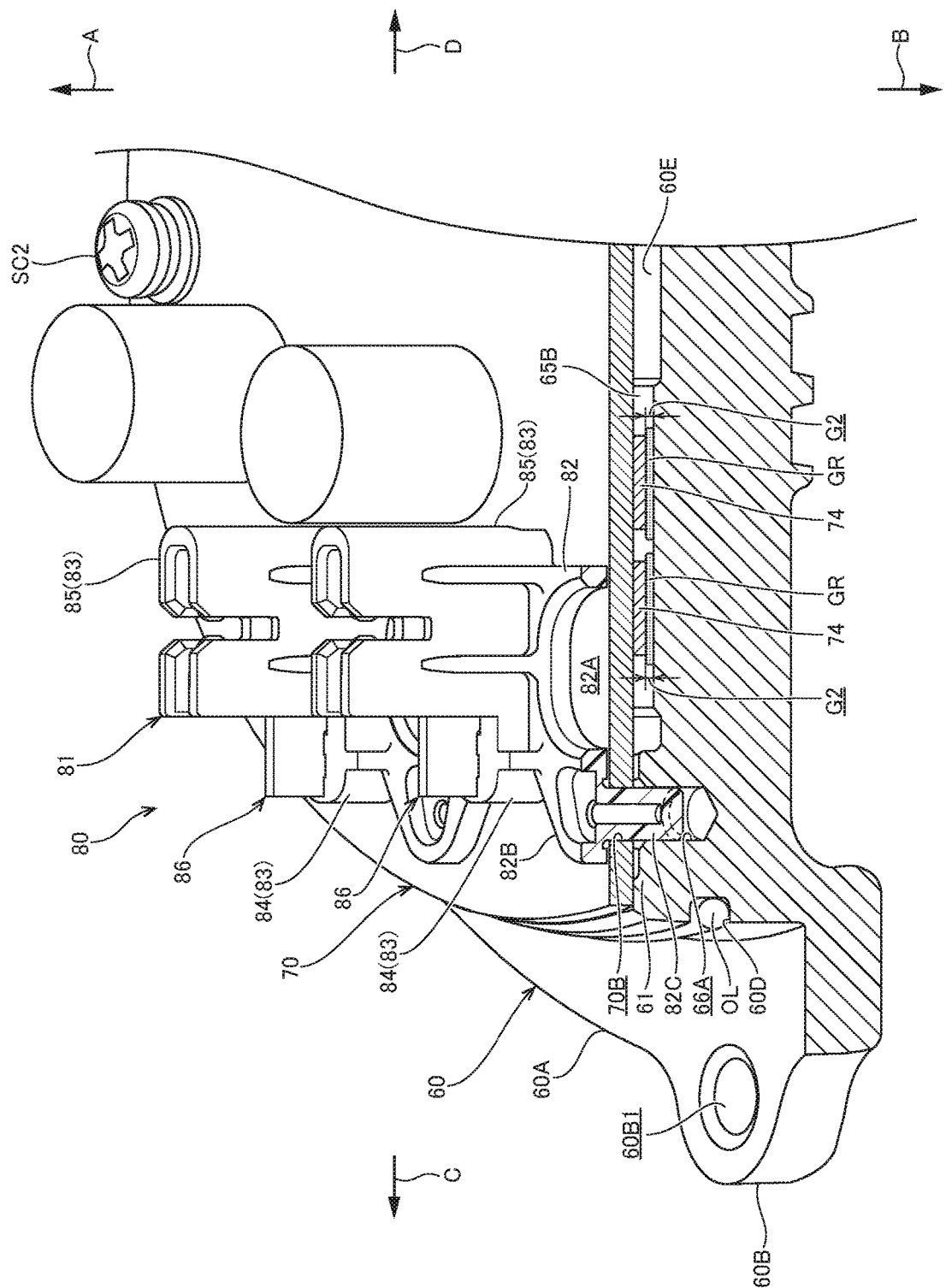
FIG. 12 is a perspective sectional view showing a state in which the positioning pin of the terminal holder in the connector shown in FIG. 4 is fitted in the first positioning hole of the heat-sink.

Further, in the fixed state of the circuit board 70 to the heat-sink 60, to form a minute gap G2 in the vertical direction between the FET 74 and the first heat dissipating portion 65A, the second heat dissipating portion 65B, and the third heat dissipating portion 65C, the amount of protrusion is set from the lower surface 60E of the heat-sink 60 of the first heat dissipating portion 65A, the second heat dissipating portion 65B, and the third heat dissipating portion 65C (cf. FIG. 12). A heat-dissipating grease GR (cf. FIG. 12) as a "heat transfer member" is provided in the gap G2. As a result, the heat generated by the FET 74 is transferred to the heat-sink 60 via the heat-dissipating grease GR.

On the other hand, a magnetic sensor 72 is provided (mounted) in the center of the lower surface (one side surface) of the circuit board 70. This magnetic sensor 72 is arranged close to the upper side of the magnet 30 on the rotating shaft 28 of the motor portion 12, and the magnetic sensor 72 and the magnet 30 are arranged so as to face each other in the vertical direction (cf. FIG. 2). As a result, the rotation amount (rotation angle) of the rotating shaft 28 is detected by the magnetic sensor 72.

Further, a pair of circular substrate-side positioning holes 70B (cf. FIG. 6) are formed through the circuit board 70 at positions corresponding to the first positioning holes 66A and the second positioning holes 67A of the heat-sink 60. The diameter dimension of the substrate side positioning hole 70B is set to be roughly the same as the diameter dimension of the first positioning hole 66A.

Further, as shown in FIGS. 3, 4 and 5, on the lower surface of the circuit board 70, a connector 80 for connecting the circuit board 70 and the motor portion 12 (three bus-bars 48) is provided on one side of the first direction (specifically, the position corresponding to the bus-bar terminal 48A described above). Hereinafter, the connector 80 will be described.

As shown in FIGS. 3, 4, 5, and 9-12, the connector 80 comprises three connection terminals 86 and a terminal holder 81 for holding the three connection terminals 86. The bus-bar terminal 48A of the bus-bar 48 is press-fitted into the connection terminal 86 to connect the motor portion 12 and the connection terminal 86. That is, the connector 80 is configured as a so-called press-fit connector.

[Terminal Holder 81]

The terminal holder 81 is made of a resin material (insulating material). The terminal holder 81 is formed in a roughly E-shaped block shape that is open downward when viewed from the first direction. Specifically, the terminal holder 81 comprises a base portion 82 that constitutes a base end portion (upper end) of the terminal holder 81, and three holding main body portions 83 that protrude downward (motor portion 12 side) from the base portion 82.

The base portion 82 is formed in a roughly rectangular plate shape with the vertical direction as the plate thickness direction and the second direction as the longitudinal direction, and is installed on the lower surface of the circuit board 70. The base portion 82 is arranged with respect to the circuit board 70 so that the central portion of the base portion 82 in the longitudinal direction coincides with the first reference line L1 in the bottom view (cf. FIG. 4). A pair of hole portions 82A are formed through the base portion 82, and the hole portions 82A are arranged at positions symmetrical with respect to the first reference line L1 in the second direction when viewed from the bottom. The hole 82A is formed in a roughly track shape with the first direction as the longitudinal direction. The head of the fixing screw SC2 is arranged in the hole 82A on the other side in the second direction.

Further, the base portion 82 is integrally formed with a pair of positioning pieces 82B extending to one side in the first direction at positions corresponding to the pair of hole portions 82A. Each positioning pin 82C is formed at the tip of the positioning piece 82B, and the positioning pin 82C is formed in a bottomed cylindrical shape that protrudes upward (circuit board 70 side) from the positioning piece 82B and is open downward. Further, the diameter of the positioning pin 82C is set to be roughly the same as the diameter of the substrate side positioning hole 70B of the circuit board 70 and the first positioning hole 66A of the heat-sink 60.

The positioning pin 82C on one side in the second direction is fitted in the positioning hole 70B on the substrate side of the circuit board 70 and in the positioning hole 66A on the first of the heat-sink 60 (cf. FIG. 12). Further, the positioning pin 82C on the other side in the second direction is fitted in the substrate side positioning hole 70B of the circuit board 70 and in the second positioning hole 67A of the heat-sink 60. As a result, the position of the terminal holder 81 (that is, the connector 80) with respect to the heat-sink 60 is determined by the positioning pin 82C.

The three holding main body portions 83 project downward from both ends in the longitudinal direction and the central portion in the longitudinal direction of the base portion 82, respectively. The holding main body portion 83 extends along the width direction (first direction) of the base portion 82 in a bottom view. Further, the holding main body portion 83 comprises a holder portion 84 that constitutes one end of the holding main body portion 83 in the first direction, and a cover portion 85 that constitutes the other end of the holding main body portion 83 in the first direction.

The holder portion 84 is formed in the shape of a roughly rectangular parallelepiped block protruding downward from the base portion 82. A pair of holding holes 84A1 and 84A2 are formed in the holder portion 84 in the central portion in the width direction (second direction) of the holding main body portion 83, and the holding holes 84A1 and 84A2 are penetrated in the vertical direction. That is, the holding holes 84A1 and 84A2 also penetrate the base portion 82. The holding holes 84A1 and 84A2 are formed in a roughly rectangular shape in a bottom view and are arranged side by side along the first direction. Further, the holding hole 84A2 arranged on the other side in the first direction is arranged at the end on the other side in the first direction of the holder portion 84, and at the end of the holder portion 84 on the other side in the first direction, the holding hole 84A2 is opened to the other side in the first direction in a bottom view. Further, the dimensions of the holding holes 84A1 and 84A2 in the second direction are set to be slightly larger than the plate thickness of the connection terminal 86 described later.

The cover portion 85 is formed in a roughly U-shaped columnar shape open to one side in the first direction in a bottom view, and is formed in a roughly flat shape with the second direction as the thickness direction. Specifically, the cover portion 85 comprises a pair of first side walls 85A with the second direction as the plate thickness direction, and a second side wall 85B connecting the ends of the pair of first side walls 85A on the other side in the first direction. The amount of protrusion of the cover portion 85 from the base portion 82 is significantly larger than the amount of protrusion of the holder portion 84 from the base portion 82. Further, one side end in the first direction at the base end of the pair of first side walls 85A is connected to the holder 84. The inside of the cover portion 85 is configured as an accommodating portion 85C for accommodating the connection terminal 86 described later.

A guide groove 85D is formed at the tip end portion (lower end portion) of the pair of first side wall 85A at the intermediate portion in the first direction. The guide groove 85D is formed in a slit shape extending in the vertical direction and is penetrated in the second direction. A pair of inclined portions 85E are formed at the opening end of the guide groove 85D, and the inclined portions 85E are inclined in a direction (outside of the guide groove 85D in the width direction) in which they are separated from each other toward the lower side (opening side of the guide groove 85D). Further, the groove width of the guide groove 85D is set to be slightly larger than the plate thickness of the bus-bar terminal portion 48A, and in the connected state between the connection terminal 86 and the bus-bar terminal 48A, which will be described later, the bus-bar terminal 48A is inserted into the guide groove 85D.

A pair of guide ribs 85F are formed on the inner peripheral surfaces of the pair of first side walls 85A. The guide ribs 85F are arranged on one side and the other side in the first direction with respect to the guide groove 85D, respectively, and extend downward from the base portion 82. The guide ribs 85F arranged to face each other in the second direction form a set, and the separation distance of the set guide ribs 85F in the second direction is set so as to roughly match the plate thickness of the connection terminal 86 described later. An inclined surface 85G is formed at the tip of the guide rib 85F, and the inclined surface 85G is inclined toward the first side wall 85A toward the lower side.

Further, in the accommodating portion 85C of the cover portion 85, a support protrusion portion 85H (cf. FIG. 11) is provided at a boundary portion of the holder portion 84 with the holding hole 84A2 arranged on the other side in the first direction. The support protrusion 85H protrudes downward from the base portion 82, and the amount of protrusion of the support protrusion 85H from the base portion 82 is smaller than the amount of protrusion of the holder portion 84 from the base portion 82. Further, the support protrusion 85H is formed in a roughly trapezoidal shape in a cross-sectional view seen from the second direction.

[Connection Terminal 86]

Figure 10:
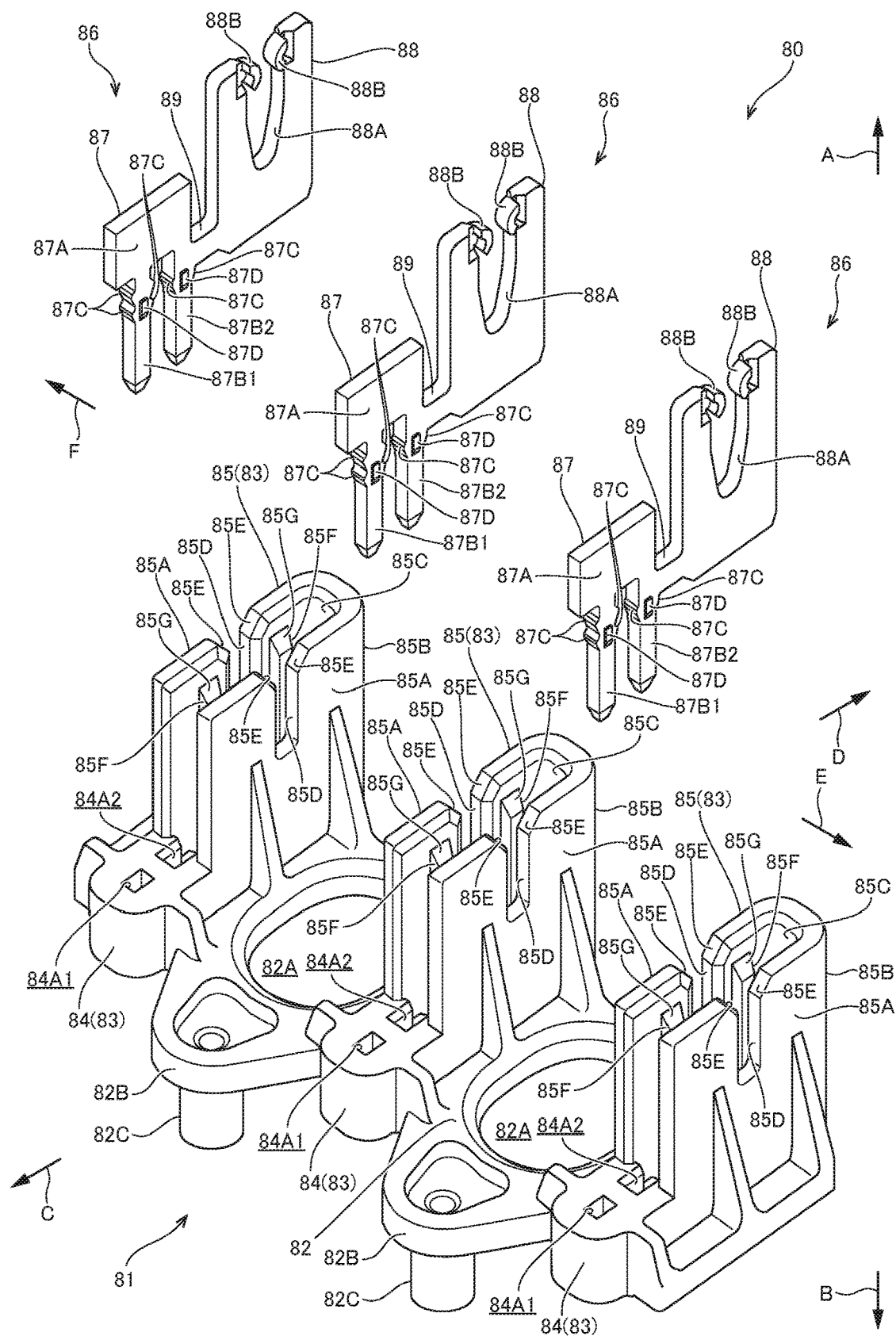
FIG. 10 is an exploded perspective view of the connector shown in FIG. 5 disassembled and viewed from below.
Figure 11:
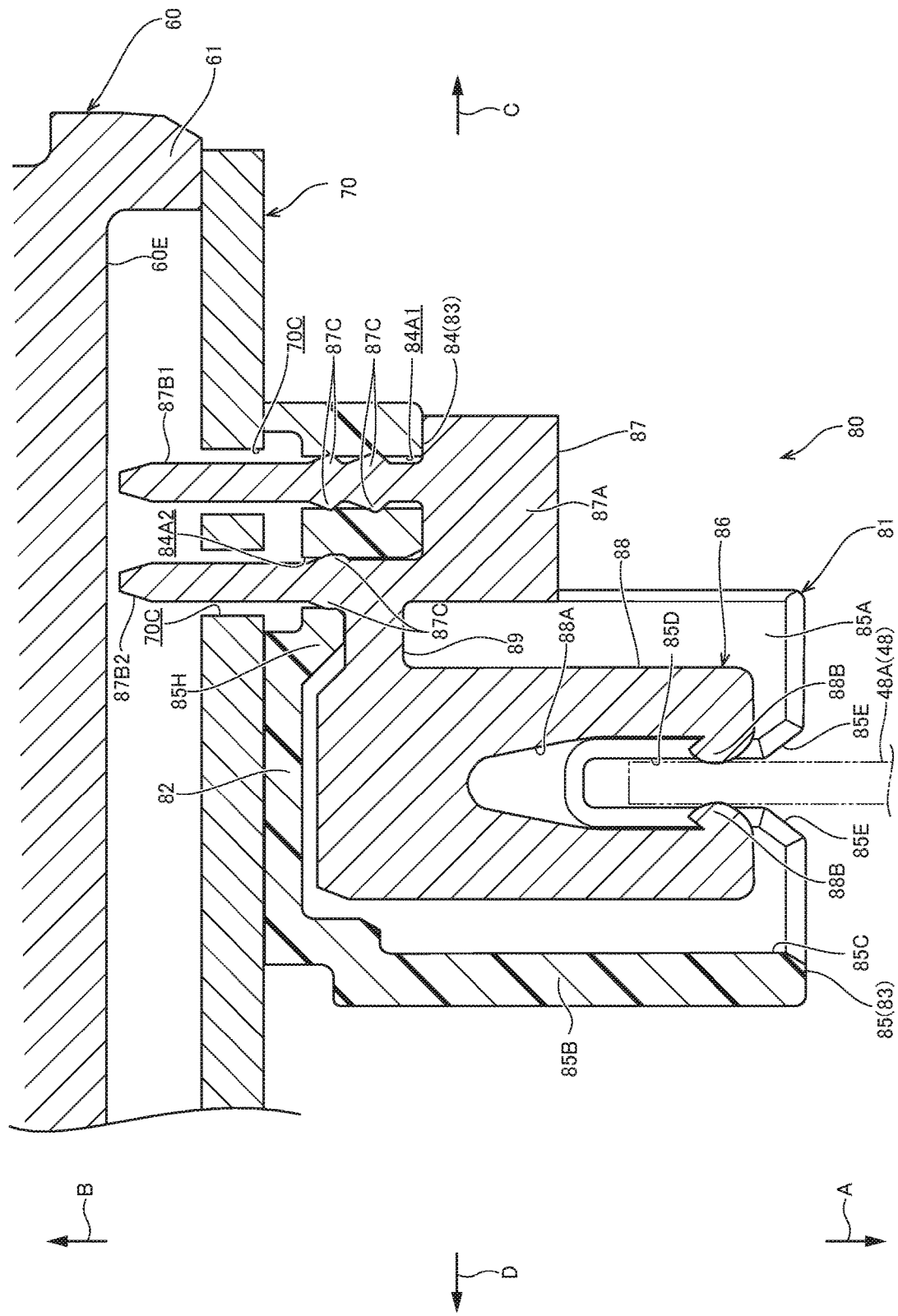
FIG. 11 is sectional view (11-11 line sectional view of FIG. 4) which shows the holding state of the connection terminal in the terminal holder in the connector shown in FIG. 4.

As shown in FIGS. 10 and 11, the connection terminal 86 consists of a metal plate material. Further, the connection terminal 86 is arranged with the second direction as the plate thickness direction, and is held by each of the three holding main body portions 83 in the terminal holder 81. The connection terminal 86 is formed in a roughly crank-shaped plate shape when viewed from the second direction. Specifically, the connection terminal 86 comprises a terminal fixing portion 87 constituting one end of the connection terminal 86 (end portion on one side in the first direction), a terminal connection portion 88 constituting the other end portion (end portion on the other side in the first direction) of the connection terminal 86, and a connecting portion 89 that connects the terminal fixing portion 87 and the terminal connection portion 88.

The terminal fixing portion 87 is formed in a roughly inverted U-shaped plate shape that is open to the upper side (circuit board 70 side) when viewed from the second direction. Specifically, the terminal fixing portion 87 comprises a base portion 87A constituting the lower end portion of the terminal fixing portion 87, and a pair of terminal portions 87B1 and 87B2 extending upward from the base portion 87A. The base portion 87A is formed in a roughly rectangular plate shape, and is arranged adjacent to the lower side of the holder portion 84 of the terminal holder 81. The pair of terminal portions 87B1 and 87B2 are arranged side by side in the first direction corresponding to the pair of holding holes 84A1 and 84A2 in the holder portion 84 of the terminal holder 81.

Further, a plurality of (four locations in the present embodiment) protruding portions 87C are integrally formed at the base end portion (lower end portion) of the terminal portion 87B1 arranged on one side in the first direction. Specifically, the two protruding portions 87C are projected from the base end portion of the terminal portion 87B1 to one side in the first direction, and are arranged side by side in the vertical direction. Further, the other two protrusions 87C are projected from the base end portion of the terminal portion 87B1 to the other side in the first direction, and are arranged side by side in the vertical direction. The protrusion 87C is formed in a roughly wedge shape when viewed from the second direction. The terminal portion 87B1 is fitted into the holding hole 84A1 from below so that the protrusion 87C wedges into the inner peripheral surface of the holding hole 84A1 of the terminal holder 81. As a result, the terminal portion 87B1 (that is, the connection terminal 86) is held by the terminal holder 81.

Further, a plurality of (in this embodiment, two locations) protrusions 87C are integrally formed on the base end side of the terminal portion 87B2 arranged on the other side in the first direction, and the protrusion 87C protrudes from the terminal portion 87B2 to one side in the first direction and the other side in the second direction. The terminal portion 87B2 is fitted into the holding hole 84A2 from below so that the protruding portion 87C wedges into the inner peripheral surface of the holding hole 84A2 of the terminal holder 81. As a result, the terminal portion 87B2 (that is, the connection terminal 86) is held by the terminal holder 81.

Further, protruding portions 87D (cf. FIG. 10) projecting to one side in the second direction are formed on the portions on the base end side of the terminal portions 87B1 and 87B2, respectively, and the protruding portion 87D is formed by a half blanking process or the like. The terminal portions 87B1, 87B2 are fitted into the holding holes 84A1, 84A2 in a state where the protruding portion 87D is in pressure contact with the inner peripheral surfaces of the holding holes 84A1, 84A2 of the terminal holder 81.

Further, the tip portions (upper end portions) of the pair of terminal portions 87B1 and 87B2 project upward than the terminal holder 81 (the circuit board 70 side) and are inserted into the terminal hole 70C of the circuit board 70, and fixed to the circuit board 70 by soldering (cf. FIG. 11). In FIG. 11, for convenience, the solder for fixing the pair of terminal portions 87B1 and 87B2 and the circuit board 70 is not shown.

The terminal connection portion 88 is formed in a roughly U-shaped plate shape that is open to the lower side (motor portion 12 side) when viewed from the second direction. That is, the terminal connection portion 88 is formed with a press-fitting groove 88A that is open downward. The groove width on the opening side of the press-fitting groove 88A is set to be larger than the groove width of the guide groove 85D of the terminal holder 81. On the other hand, the groove width on the bottom side of the press-fitting groove 88A is set to become smaller toward the bottom of the press-fitting groove 88A.

A terminal press-fitting portion 88B is respectively formed at the open end of the press-fitting groove 88A. The terminal press-fitting portion 88B is bent to one side in the second direction, and is formed in a roughly semicircular shape that is convex inward in the groove width direction of the press-fitting groove 88A when viewed from the second direction. The distance between the pair of terminal press-fitting portions 88B in the first direction is set to be slightly shorter than the plate thickness of the bus-bar terminal portion 48A.

Further, the terminal connection portion 88 is housed in the accommodating portion 85C of the terminal holder 81, and the entire terminal connection portion 88 is covered by the cover portion 85 of the terminal holder 81. In the state of accommodating the terminal connection portion 88 in the accommodating portion 85C, the lower end of the terminal connection portion 88 is arranged on the upper side of the inclined portion 85E of the terminal holder 81, and in the first direction, the guide groove 85D of the terminal holder and the press-fitting groove 88A of the terminal connection portion 88 are arranged at the same positions. Specifically, when viewed from the second direction, a part (top portion of the arc-shape) of the pair of terminal press-fitting portions 88B is arranged at a position above than the inclined portion 85E of the terminal holder 81, and at the same time, the guide groove 85D is arranged so as to project inward in the groove width direction. As a result, the bus-bar terminal portion 48A of the bus-bar 48 is press-fitted between the pair of terminal press-fitting portions 88B, and the terminal press-fitting portion 88B is press-fitted to the bus-bar terminal portion 48A.

Further, in this accommodation state, the terminal connection portion 88 is sandwiched in the second direction by the guide rib 85F of the terminal holder 81, and is arranged so as to be separated from the base portion 82 (that is, the circuit board 70) of the terminal holder 81 on the lower side. That is, a gap is formed between the terminal connection portion 88 and the base portion 82, and the terminal connection portion 88 is held by the terminal holder 81 so as to be relatively displaceable in the vertical direction.

The connecting portion 89 is formed in a roughly rectangular plate shape with the second direction as the plate thickness direction, and connects the base end portion of the other terminal portion 87B2 of the terminal fixing portion 87 and the upper end portion of the terminal connection portion 88. That is, the connection terminal 86 is formed in a flat plate shape having no bent portion, except for the terminal press-fitting portion 88B in the terminal connection portion 88. Further, the connecting portion 89 is arranged above than the press-fitting groove 88A (on the circuit board 70 side) and is accommodated in the accommodating portion 85C of the terminal holder 81. That is, the connecting portion 89 and the press-fitting groove 88A are arranged so as to be offset in the vertical direction.

Further, the portion of the connecting portion 89 on the terminal fixing portion 87 side is arranged adjacent to the support protrusion 85H of the terminal holder 81 on the lower side and is in contact with the support protrusion 85H. In other words, the support protrusion 85H supports the portion of the connecting portion 89 on the terminal fixing portion 87 side from the circuit board 70 side. As a result, when an upward press-fitting load acts on the terminal connection portion 88 when the bus-bar 48 is press-fitted into the terminal connection portion 88, the support protrusion 85H is configured to receive the press-fitting load. Further, when a press-fitting load of a predetermined value or more is input to the connecting portion 89, the connecting portion 89 is configured to bend and deform starting from the contact portion with the support protrusion 85H so that the terminal connection portion 88 is displaced toward the circuit board 70 side.

<Connector Assembly 90>

As shown in FIGS. 1 to 6, the connector assembly 90 has a mold portion 91, and the mold portion 91 is made of a resin material (insulating material). The mold portion 91 comprises a mold base 92, and the first connector portion 93A, the second connector portion 93B, and the third connector portion 93C in three places. The mold base 92 is formed in a plate shape with the vertical direction as the plate thickness direction. The mold base 92 is arranged adjacent to the upper side of the portion of the heat-sink 60 on the other side in the first direction, and closes the terminal insertion portion 60G of the heat-sink 60. In other words, the heat dissipating portion 65 (the portion on one side in the first direction) of the heat sink 60 is not covered by the mold base 92 (mold portion 91) and is exposed to the outside of the rotary electric machine 10.

Five fixing holes 92A are formed through the mold base at positions corresponding to the first fixing screw portion 60C1 and the second fixing screw portion 60J of the heat-sink 60. The mold base 92 (that is, connector assembly 90) is fixed to the heat-sink 60 by inserting the fixing screw SC3 into the fixing hole 92A and screwed into the first fixing screw portion 60C1 and the second fixing screw portion 60J.

The first connector portion 93A, the second connector portion 93B, and the third connector portion 93C are each formed in a tubular shape, and extend downward from the other end in the first direction of the mold base 92. Further, the first connector portion 93A, the second connector portion 93B, and the third connector portion 93C are arranged on the outer side in the radial direction of the upper end portion of the housing 20, and are arranged side by side in the circumferential direction of the housing 20. That is, the first connector portion 93A to the third connector portion 93C are formed in a tubular shape that is open downward.

Further, the mold base 92 (connector assembly 90) is arranged with respect to the circuit board 70 so that the mold base 92 and the FET 74 of the circuit board 70 do not overlap in a plan view (cf. FIG. 8). In other words, the heat dissipating portion 65 of the heat-sink 60 is not covered by the mold base 92 (mold portion 91) and is exposed to the outside of the rotary electric machine 10 (cf. FIG. 1).

Further, the connector assembly 90 has a plurality of terminals 94 for connecting the circuit board 70 and the control unit of the vehicle, and the terminal 94 is integrally formed with the mold portion 91. Specifically, an intermediate portion in the longitudinal direction of the terminal 94 passes through the terminal insertion portion 60G of the heat-sink 60, and one end of the terminal 94 is soldered to the circuit board 70. As a result, the soldered state of one end of the terminal 94 to the circuit board 70 can be visually recognized from the gap G1 between the step portion 62 of the heat-sink 60 and the circuit board 70 (cf. FIG. 4B). Further, the other end of the terminal 94 is arranged inside the first connector portion 93A, the second connector portion 93B, and the third connector portion 93C, respectively. The external connector on the vehicle side is connected to the first connector portion 93A—third connector portion 93C. As a result, it is configured that a current is supplied to the circuit board 70 from the vehicle side, and a control signal is output and the motor portion 12 is driven by the control of the circuit board 70.

(Effect)

Next, the operation and effect of the present embodiment will be described.

In the rotary electric machine 10 configured as described above, a circuit board 70 is arranged adjacent to the lower side of the heat-sink 60, and a first installation portion 61 and a second installation portion 63 projecting downward are formed on the lower surface 60E of the heat-sink 60. The circuit board 70 is installed on the tip surface of the first installation portion 61 and the tip surface of the second installation portion 63 of the heat-sink 60, and is fixed to the heat-sink 60 by the fixing screw SC2. Further, a plurality of FETs 74 are mounted on the upper surface of the circuit board 70, and the FETs 74 are arranged close to the first heat dissipating portion 65A, the second heat dissipating portion 65B, and the third heat dissipating portion 65C of the heat-sink 60. Specifically, a minute gap G2 is formed between the FET 74 and the first heat dissipating portion 65A, the second heat dissipating portion 65B, and the third heat dissipating portion 65C, and a heat-dissipating grease GR is interposed in the gap G2. Therefore, the heat generated by the FET 74 is transferred from the first heat dissipating portion 65A, the second heat dissipating portion 65B, and the third heat dissipating portion 65C to the heat-sink 60 via the heat-dissipating grease GR. Then, the heat transferred to the heat-sink 60 is dissipated from the heat dissipating portion 65 to the outside of the rotary electric machine 10.

Here, the portions of the circuit board 70 that are installed in the first installation portion 61 and the second installation portion 63 of the heat-sink 60 are configured as non-coated portions 71, and the non-coated portion 71 is not coated with a resist. Therefore, the circuit board 70 can be installed in the first installation portion 61 and the second installation portion 63 of the heat-sink 60 without being affected by the variation in the film thickness of the resist. As a result, the gap G2 between the FET 74 mounted on the circuit board 70 and the first heat dissipating portion 65A, the second heat dissipating portion 65B, and the third heat dissipating portion 65C of the heat-sink 60 can be set as small as possible.

That is, as compared with the comparative example in which the resist was applied to the non-coated portion 71 of the circuit board 70, the gap G2 can be set small, and the FET 74 can be arranged at a position closer to the first heat dissipating portion 65A, the second heat dissipating portion 65B, and the third heat dissipating portion 65C. As a result, the heat conduction path in the heat-dissipating grease GR can be shortened. Therefore, as compared with the above comparative example, the heat generated by the FET 74 can be efficiently transferred to the heat-sink 60. As described above, the heat dissipation effect of the heat-sink 60 on the FET 74 can be enhanced.

Further, a ground pattern is formed on the non-coated portion 71 of the circuit board 70. Therefore, the circuit board 70 is ground-installed on the first installation portion 61 of the heat-sink 60. Further, the first installation portion 61 is formed on the outer peripheral portion of the heat-sink 60 and is formed in a roughly arc shape extending in the circumferential direction. The FET 74 of the circuit board 70 is arranged inside in the radial direction of the first installation portion 61 of the heat-sink 60 in a bottom view. Therefore, the arrangement configuration can be configured so as to surround the FET 74 by the first installation portion 61. As a result, the first installation portion 61 functions as a shield portion that shields electrical noise from the FET 74. As a result, for example, radiation noise from the FET 74 can be reduced. Therefore, the reliability of the rotary electric machine 10 can be improved.

Further, the length of the first installation portion 61 of the heat-sink 60 in the longitudinal direction is set to ½ or more of the length of the entire circumference of the heat-sink 60 in the circumferential direction. For this reason, the FET 74 can surround more than half of the circuit board 70. Therefore, the shielding effect of the first installation portion 61 on the electronic components mounted on the circuit board 70 including the FET 74 can be enhanced.

Further, a step portion 62 that goes down one step to the upper side than the tip surface (lower surface) of the first installation portion 61 is formed on the outer peripheral portion of the lower surface of the heat-sink 60 on the other side in the first direction, and the step portion 62 is arranged so as to be separated upward from the circuit board 70. As a result, a gap G1 is formed between the step portion 62 and the circuit board 70. Further, in the heat-sink 60, a terminal insertion portion 60G through which the terminal 94 of the connector assembly 90 is inserted is arranged inside in the radial direction of the step portion 62. As a result, the terminal 94 of the connector assembly 90 is configured to be visible from the gap G1 between the step portion 62 and the circuit board 70. Therefore, when the connector assembly 90 is assembled to the heat-sink 60, the soldered state between the terminal 94 and the circuit board 70 can be confirmed from the gap G1. Therefore, workability when assembling the connector assembly 90 to the heat-sink 60 can be improved.

Further, in the heat-sink 60, the second installation portion 63 is arranged between the first heat dissipating portion 65A and the second heat dissipating portion 65B in a bottom view. Therefore, in the ECU unit 14, the second installation portion 63 is arranged between the first group of the FET 74 and the second group of the FET 74 in a bottom view. The circuit board 70 is fixed to the second installation portion 63 by the fixing screw SC2.

Thereby, for example, even when the circuit board 70 warps in the direction away from the heat-sink 60, the warp of the circuit board 70 can be corrected and the circuit board 70 can be fixed to the heat-sink 60. Therefore, it is possible to prevent the gap G2 between the FET 74 and the first heat dissipating portion 65A, the second heat dissipating portion 65B, and the third heat dissipating portion 65C of the heat-sink 60 from becoming large.

Further, for example, even when the circuit board 70 warps toward the heat-sink 60, the circuit board 70 comes into contact with the second installation portion 63. Therefore, the displacement of the circuit board 70 toward the heat-sink 60 can be suppressed. Therefore, it is possible to secure a gap G2 between the first heat dissipating portion 65A, the second heat dissipating portion 65B, and the third heat dissipating portion 65C of the heat-sink 60.

As described above, the heat dissipation effect of the heat-sink 60 on the FET 74 can be stabilized.

Further, in the ECU unit 14, the first group of FETs 74 is arranged between the second installation portion 63 and the second substrate fixing portion 61B, and the second group of FETs 74 is arranged between the third substrate fixing portion 61C and the second installation portion 63. That is, the circuit board 70 is fixed to the heat-sink 60 at the portions on both sides in the second direction with respect to the first group of the FET 74, and is fixed to the heat-sink 60 at the portions on both sides in the second direction with respect to the second group of the FET 74. Therefore, the gap G2 between the FET 74 and the first heat dissipating portion 65A, the second dissipating portion 65B, and the third heat dissipating portion 65C of the heat-sink 60 can be further stabilized. Therefore, it is possible to effectively stabilize the heat dissipation effect of the heat-sink 60 with respect to the FET 74.

Further, the upper surface of the circuit board 70 is divided into a first area 70AR1 and a second area 70AR2, wherein the first area 70AR1 is mainly provided with electronic components of the power supply system in the rotary electric machine 10, and the second area 70AR2 is mainly provided with electronic components of the control system in the rotary electric machine 10. The heat-sink 60 is formed with a recess 60F opened to the side of the second area 70AR2 at a portion facing the second area 70AR2 in the vertical direction. Therefore, in the circuit board 70, electronic components of the control system having a relatively high height can be arranged in the second area 70AR2.

In the present embodiment, the outer peripheral portion of the lower surface 60E of the heat-sink 60 is composed of the first installation portion 61 and the step portion 62. However, the outer peripheral portion of the lower surface 60E of the heat-sink 60 may be configured by only the first installation portion 61. That is, the entire outer peripheral portion of the circuit board 70 may be installed in the first installation portion 61. In this case, the sealing effect of the first installation portion 61 on electronic components such as the FET 74 can be further enhanced.

Further, in the present embodiment, the length of the first installation portion 61 of the heat-sink 60 in the longitudinal direction is set to ½ or more of the length of the entire circumference of the heat-sink 60 in the circumferential direction. However, the length of the first installation portion 61 in the longitudinal direction may be set to less than ½ of the length of the entire circumference of the heat-sink 60 in the circumferential direction.

Although the present embodiment has been described above, according to the rotary electric machine of these embodiments, the clearance between the heat generating element and the heat-sink can be set without considering the variation in the coating thickness of the resist, therefore, the heat conduction path of the heat transfer member can be shortened, and the heat dissipation effect of the heat-sink on the heat generating element can be enhanced.

DESCRIPTION OF THE REFERENCE NUMERALS

10 Rotary electric machine, 12 Motor portion, 20 Housing, 60 Heat-sink, 61 First installation portion (installation portion), 70 Circuit board (substrate), 71 Non-coated portion, GR heat-dissipation grease (heat transfer member)

The invention claimed is:

1. A rotary electric machine, comprising:
a motor unit with a bottomed cylindrical housing with one end in the axial direction closed;
a heat-sink that closes the opening of the housing and has a protruding installation portion;
a substrate that is fixed to the installation portion and is configured as a non-coating portion to which the portion installed in the installation portion is not coated with a resist;
a heat generating element mounted on a surface of the substrate facing the heat-sink; and
a heat transfer member provided between the heat-sink and the heat generating element;
the installation portion having a first installation portion extending in the circumferential direction on the outer peripheral portion of the heat-sink;
a ground pattern being formed on the non-coated portion installed in the first installation portion; and
the heat generating element being arranged inside the first installation portion when viewed from the plate thickness direction of the substrate.

2. The rotary electric machine according to claim 1 wherein:
the length of the first installation portion in the longitudinal direction is set to ½ or more of the length of the entire circumference of the heat-sink in the circumferential direction.

* * * * *